US012581892B2

(12) United States Patent
Jo et al.

(10) Patent No.: US 12,581,892 B2
(45) Date of Patent: Mar. 17, 2026

(54) METHOD OF MANUFACTURING DISPLAY APPARATUS

(71) Applicants:Samsung Display Co., Ltd., Yongin-si (KR); TES Co., Ltd, Yongin-si (KR); LTC Co., Ltd, Hwaseong-si (KR)

(72) Inventors: Gugrae Jo, Yongin-si (KR); Hyoungsik Kim, Yongin-si (KR); Woojin Cho, Yongin-si (KR); Jongsoon Lee, Hwaseong-si (KR); Hongjae Lee, Yongin-si (KR); Kyusang Kim, Hwaseong-si (KR); Seonjeong Kim, Hwaseong-si (KR); Heejeon Ma, Yongin-si (KR); Wonil Park, Yongin-si (KR); Kicheon Byun, Hwaseong-si (KR); Woojin Lee, Yongin-si (KR)

(73) Assignees: Samsung Display Co., Ltd., Yongin-si (KR); TES Co., Ltd, Yongin-si (KR); LTC Co., Ltd, Hwaseong-si (KR)

( * ) Notice: Subject to any disclaimer, the term of this patent is extended or adjusted under 35 U.S.C. 154(b) by 342 days.

(21) Appl. No.: 18/308,740

(22) Filed: Apr. 28, 2023

(65) Prior Publication Data

US 2023/0354687 A1     Nov. 2, 2023

(30) Foreign Application Priority Data

Apr. 29, 2022     (KR) ......................... 10-2022-0053809

(51) Int. Cl.
| | |
|---|---|
| *H01L 21/02* | (2006.01) |
| *H01L 21/311* | (2006.01) |
| *H10K 59/124* | (2023.01) |

(52) U.S. Cl.
CPC .. *H01L 21/02063* (2013.01); *H01L 21/31116* (2013.01); *H10K 59/124* (2023.02)

(58) Field of Classification Search
CPC ................................................. H01L 21/02063
See application file for complete search history.

(56) References Cited

U.S. PATENT DOCUMENTS

| | | | |
|---|---|---|---|
| 6,500,766 B2 * | 12/2002 | Lu ..................... | H01L 21/02046 |
| | | | 438/711 |
| 7,166,534 B2 | 1/2007 | Jung | |
| 10,861,693 B2 | 12/2020 | Stone et al. | |
| 11,004,923 B2 | 5/2021 | Lim et al. | |
| 2002/0081859 A1 | 6/2002 | Lu et al. | |
| 2009/0102751 A1 * | 4/2009 | Takatoku ............. | G09G 3/3659 |
| | | | 345/55 |

FOREIGN PATENT DOCUMENTS

| | | |
|---|---|---|
| KR | 10-2003-0027453 | 4/2003 |
| KR | 10-2018-0085807 A | 7/2018 |
| KR | 10-2019-0063940 A | 6/2019 |
| KR | 10-2019-0073848 A | 6/2019 |

* cited by examiner

*Primary Examiner* — Amar Movva
(74) *Attorney, Agent, or Firm* — Innovation Counsel LLP

(57) ABSTRACT

A method of manufacturing a display apparatus includes forming a semiconductor layer on a substrate, forming an insulating layer on the semiconductor layer, forming a photoresist pattern on the insulating layer, forming, by etching the insulating layer, a contact hole exposing at least a portion of the semiconductor layer, and performing a primary cleaning of the insulating layer in which the contact hole is formed using a cleaning gas including a fluorine-containing gas and a hydrogen-containing gas.

19 Claims, 20 Drawing Sheets

110

100

Act

Act   GE

111

113

110

100

CNT          Act   GE

METHOD OF MANUFACTURING DISPLAY APPARATUS

CROSS-REFERENCE TO RELATED APPLICATION(S)

This application claims priority to and benefits of Korean Patent Application No. 10-2022-0053809 under 35 U.S.C. § 119, filed on Apr. 29, 2022, in the Korean Intellectual Property Office (KIPO), the contents of which are incorporated by reference herein in its entirety.

BACKGROUND

1. Technical Field

One or more embodiments relate to a method of manufacturing a display apparatus.

2. Description of the Related Art

Display apparatuses display data visually. Display apparatuses are used as displays of compact products such as mobile phones or large-sized products such as televisions.

A display apparatus includes multiple pixels which receive an electrical signal and emit light to display an image to the outside. Each pixel includes a display element; for example, an organic light-emitting display apparatus includes an organic light-emitting diode (OLED) as a display element. In general, an organic light-emitting display apparatus includes a thin-film transistor and an organic light-emitting diode formed on a substrate thereof, and operates with the organic light-emitting diode emitting light by itself.

As the usage of display apparatuses has recently become diverse, various attempts are being made in making designs for improving the quality of display apparatuses.

SUMMARY

One or more embodiments include a display apparatus and a method of manufacturing the same, in which a damage to an insulating layer including a silicon insulating layer may be prevented or minimized by performing a dry cleaning when forming a contact hole exposing at least a portion of a semiconductor layer. However, the above objective is an example, and the scope of the embodiments of the disclosure is not limited by the above objective.

Additional aspects will be set forth in part in the description which follows and, in part, will be apparent from the description, or may be learned by practice of the presented embodiments of the disclosure.

According to one or more embodiments, a method of manufacturing a display apparatus may include forming a semiconductor layer on a substrate, forming an insulating layer on the semiconductor layer, forming a photoresist pattern on the insulating layer, forming, by etching the insulating layer, a contact hole exposing at least a portion of the semiconductor layer, and performing a primary cleaning of the insulating layer in which the contact hole is formed, by using a cleaning gas including a fluorine-containing gas and a hydrogen-containing gas.

The insulating layer may have a structure in which a plurality of silicon oxide layers and a plurality of silicon nitride layers are alternately stacked each other.

In the primary cleaning, at least a portion of the plurality of silicon oxide layers and at least a portion of the plurality of silicon nitride layers may be etched.

A width of the contact hole after the primary cleaning is performed may be greater than a width of the contact hole before the primary cleaning is performed.

In the primary cleaning, a difference between an etch rate of the plurality of silicon oxide layers and an etch rate of the plurality of silicon nitride layers may be about 5% or less.

In the primary cleaning, the fluorine-containing gas may include at least one of hydrofluoric acid gas and nitrogen trifluoride gas, and the hydrogen-containing gas may include at least one of ammonia gas and hydrogen gas.

The cleaning gas may include the hydrofluoric acid gas and the ammonia gas, and a flow rate ratio between the hydrofluoric acid gas and the ammonia gas may be in a range of about 0.5:1 to about 1:0.5.

The cleaning gas may further include an inert gas.

The inert gas may be provided at a flow rate in a range of about two times to about eight times of a flow rate of the fluorine-containing gas.

The primary cleaning may be performed at a process pressure in a range of about 1500 mTorr to about 2000 mTorr.

The primary cleaning may be performed at a process temperature in a range of about 30° C. to about 90° C.

The primary cleaning may be performed for between about 20 seconds and about 80 seconds.

The method may further include, after the forming of the semiconductor layer on the substrate, forming a gate insulating layer on the semiconductor layer, and forming a gate electrode on the gate insulating layer.

The method may further include, after the performing of the primary cleaning, performing, by using pure water, a secondary cleaning of, the insulating layer in which the contact hole is formed and on which the primary cleaning has been performed, and removing the photoresist pattern from the insulating layer.

The method may further include, after the removing of the photoresist pattern, forming a connection electrode on the insulating layer, and forming, on the connection electrode, a light-emitting device including a first electrode, an emission layer, and a second electrode.

According to one or more embodiment, a method of manufacturing a display apparatus, may include performing a primary cleaning of an insulating layer in which a contact hole is formed, by using a cleaning gas including a fluorine-containing gas and a hydrogen-containing gas, and performing, by using pure water, a secondary cleaning of the insulating layer in which the contact hole is formed and on which the primary cleaning has been performed.

The insulating layer may have a structure in which a plurality of silicon oxide layers and a plurality of silicon nitride layers are alternately stacked each other.

In the primary cleaning, at least a portion of the plurality of silicon oxide layers and at least a portion of the plurality of silicon nitride layers may be etched, and a difference between an etching rate of the silicon oxide layers and an etching rate of silicon nitride layers may be about 5% or less.

The primary cleaning may be performed at a process pressure in a range of about 1500 mTorr to about 2000 mTorr, at a substrate temperature in a range of about 30° C. to about 90° C., and for between about 20 seconds and about 80 seconds.

The cleaning gas may include hydrofluoric acid gas and ammonia gas, and a flow rate ratio between the hydrofluoric acid gas and the ammonia gas may be in a range of about 0.5:1 to about 1:0.5.

In addition to the aforesaid details, other aspects, features, and advantages will be clarified from the following drawings, claims, and detailed description.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION OF THE EMBODIMENTS

Figure 1:
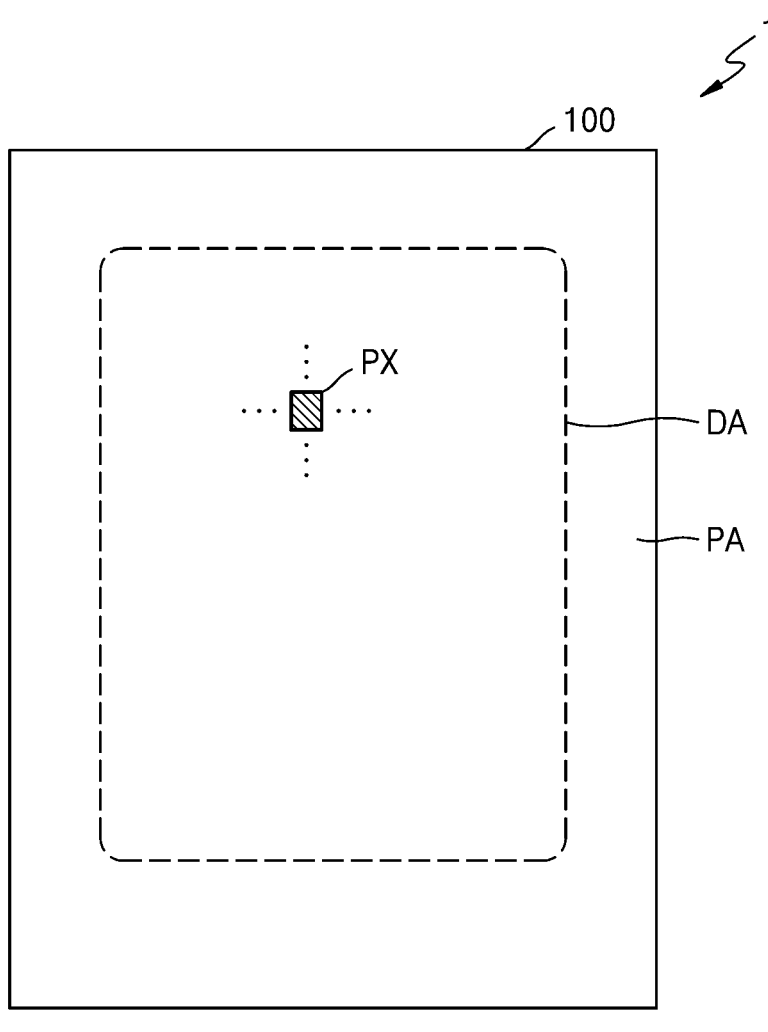
FIG. 1 is a schematic plan view of a display apparatus according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are merely described below, by referring to the figures, to explain aspects of the description. As used herein, the term "and/or" includes any and all combinations of one or more of the associated listed items. Throughout the disclosure, the expression "at least one of a, b and c" indicates only a, only b, only c, both a and b, both a and c, both b and c, all of a, b, and c, or variations thereof.

As the disclosure allows for various changes and numerous embodiments, particular embodiments will be illustrated in the drawings and described in detail in the written description. The effects and features of the disclosure, and ways to achieve them will become apparent by referring to embodiments that will be described later in detail with reference to the drawings. However, the disclosure is not limited to the following embodiments but may be embodied in various forms.

It will be understood that although the terms "first", "second", etc. are used herein to describe various elements, these elements should not be limited by these terms. These terms are only used to distinguish one element from another. Thus, a first element discussed below could be termed a second element without departing from the teachings of the disclosure.

As used herein, the singular forms, "a", "an", and "the" are intended to include the plural forms as well, unless the context clearly indicates otherwise. Moreover, the terms "comprises", "comprising", "includes", and/or "including" when used in this specification, specify the presence of stated features, integers, steps, operations, elements, components, and/or groups thereof, but do not preclude the presence or addition of one or more other features, integers, steps, operations, elements, components, and/or groups thereof.

The terms "about" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within $\pm30\%$, 20%, 10%, 5% of the stated value.

When an element, such as a layer, is referred to as being "on", "connected to", or "coupled to" another element or layer, it may be directly on, connected to, or coupled to the other element or layer or intervening elements or layers may be present. When, however, an element or layer is referred to as being "directly on", "directly connected to", or "directly coupled to" another element or layer, there are no intervening elements or layers present. To this end, the term "connected" may refer to physical, electrical, and/or fluid connection, with or without intervening elements.

Spatially relative terms, such as "beneath", "below", "under", "lower", "above", "upper", "over", "higher", "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below", for example, can encompass both an orientation of above and below. Furthermore, the apparatus may be otherwise oriented (e.g., rotated 90 degrees or at other orientations), and, as such, the spatially relative descriptors used herein interpreted accordingly.

Also, in the drawings, for convenience of description, sizes of elements may be exaggerated or contracted. For example, since sizes and thicknesses of elements in the drawings are arbitrarily illustrated for convenience of explanation, the following embodiments are not limited thereto.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or".

In the embodiments below, when a wire is described as "extending in a first direction or a second direction" includes a case where the wire extends in a linear form but also in a zigzag form or a curved form along the first direction or the second direction.

In the embodiments below, "in a plan view" indicates a view of a portion of an object seen from above, and "in a cross-sectional view" indicates a view of a portion of an object on a cross-section cut in a perpendicular direction. In the embodiments below, the term "overlap" includes both overlapping "in a plan view" and "in a cross-sectional view".

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification.

Hereinafter, embodiments will be described in detail with reference to the accompanying drawings, and in the description with reference to the drawings, like reference numerals refer to like elements.

FIG. 1 is a schematic plan view of a display apparatus according to an embodiment.

Referring to FIG. 1, a display apparatus 1 may include a display area DA for displaying an image and a peripheral area PA arranged adjacent to the display area DA. The display apparatus 1 may provide an image to the outside by using light emitted from the display area DA.

A substrate 100 may include glass or polymer resin. In an embodiment, the substrate 100 may include a flexible material. A flexible material may be a material that is readily bendable, foldable or rollable. For example, a flexible material may include ultra-thin glass, metal, or plastic.

In the display area DA of the substrate 100, pixels PX including various display elements such as organic light-emitting diode (OLED) may be arranged. The pixels PX may be provided in plurality, and the pixels PX may be arranged in various forms such as a striped arrangement, a PenTile™ arrangement, or a mosaic arrangement, to display an image.

In an embodiment, the display area DA may be provided in a rectangular shape in a plan view like FIG. 1. In another embodiment, the display area DA may be provided in a polygonal shape such as a triangle, a pentagon, or a hexagon, or in a circular shape, an oval shape, or an amorphous shape.

The peripheral area PA of the substrate 100 may be arranged adjacent to the display area DA, and may be an area where no image is displayed. Pads may be disposed in the peripheral area PA, and various wires via which an electrical signal applied to the display area DA is transmitted, a printed circuit board, or a driver IC chip may be attached to the pads.

Figure 2:
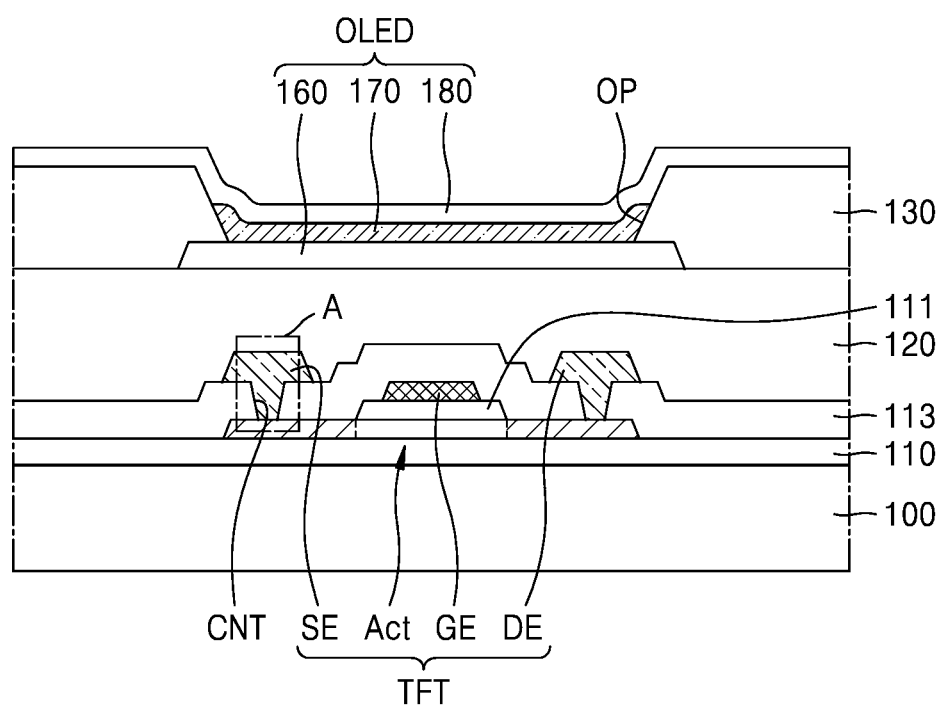
FIG. 2 is a schematic cross-sectional view of a display apparatus according to an embodiment.

FIG. 2 is a schematic cross-sectional view of a display apparatus according to an embodiment.

Referring to FIG. 2, the display apparatus 1 may include the substrate 100, a thin-film transistor TFT, and a light-emitting device OLED.

The substrate 100 may include glass or a polymer resin. The polymer resin may include at least one of polyether-sulfone, polyarylate, polyether imide, polyethylene naphthalate, polyethylene terephthalate, polyphenylene sulfide, polyimide, polycarbonate, cellulose triacetate, cellulose acetate propionate, and the like. The substrate 100 may have a structure in which a layer including an organic material and a layer including an inorganic material are alternately stacked each other. For example, the substrate 100 may include a first base layer, a first barrier layer, a second base layer, and a second barrier layer that are sequentially stacked.

A buffer layer 110 may be disposed on the substrate 100. The buffer layer 110 may reduce or block penetration of foreign substances, moisture, and/or external air from below the substrate 100. The buffer layer 110 may include an inorganic material such as silicon oxide, silicon oxynitride, or silicon nitride, and may be provided as a single layer or multiple layers including the above-described material.

The thin-film transistor TFT may be disposed on the buffer layer 110. The thin-film transistor TFT may include a semiconductor layer Act, a gate electrode GE, and a connection electrode. The connection electrode may include a source electrode SE and a drain electrode DE.

In an embodiment, the semiconductor layer Act may be disposed on the buffer layer 110. The semiconductor layer Act may include a channel region, a source region, and a drain region. The source region and the drain region may be located on both sides of the channel region. The source region and the drain region may be doped with an impurity, and the impurity may include an N-type impurity or a P-type impurity.

In an embodiment, the semiconductor layer Act may include at least one of an oxide semiconductor material and a silicon semiconductor material. In case that the semiconductor layer Act includes an oxide semiconductor material, the semiconductor layer Act may include an oxide of at least one material selected from the group consisting of indium (In), gallium (Ga), tin (Sn), zirconium (Zr), vanadium (V), hafnium (Hf), cadmium (Cd), germanium (Ge), chromium (Cr), titanium (Ti), aluminum (Al), cesium (Cs), cerium (Ce) and zinc (Zn). For example, the semiconductor layer Act may include ZnO with a metal such as indium (In), gallium (Ga), and tin (Sn), such as, In—Ga—Zn—O (IGZO), In—Sn—Zn—O (ITZO), In—Ga—Sn—Zn—O (IGTZO), and the like. In case that the semiconductor layer Act includes a silicon semiconductor material, the semiconductor layer Act may include amorphous silicon or polysilicon.

In an embodiment, the gate electrode GE may be disposed on the semiconductor layer Act. The gate electrode GE may overlap the semiconductor layer Act, with a gate insulating layer 111 therebetween. For example, the semiconductor layer Act and the gate electrode GE may be insulated from each other by the gate insulating layer 111. The gate electrode GE may include aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), copper (Cu), or the like, and may be formed as a single layer or multiple layers including one or more of the materials.

In an embodiment, the gate insulating layer 111 may be patterned to overlap a portion of the semiconductor layer Act disposed thereunder. For example, the gate insulating layer 111 may be patterned to expose at least a portion of the source region and/or the drain region of the semiconductor layer Act. For example, the gate insulating layer 111 may be patterned to correspond to the channel region of the semiconductor layer Act. Also, the gate insulating layer 111 may be patterned to correspond to the gate electrode GE disposed thereon. However, the disclosure is not limited thereto. For example, the gate insulating layer 111 may cover the semiconductor layer Act and/or the buffer layer 110.

The gate insulating layer 111 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), and the like. The zinc oxide ($ZnO_x$) may include zinc oxide (ZnO) and/or zinc peroxide ($ZnO_2$).

In an embodiment, an interlayer insulating layer 113 (for example, an insulating layer) may be disposed on the gate electrode GE. The interlayer insulating layer 113 may include at least one of silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZnO_x$), and the like. The zinc oxide ($ZnO_x$) may include zinc oxide (ZnO) and zinc peroxide ($ZnO_2$).

Figure 3:
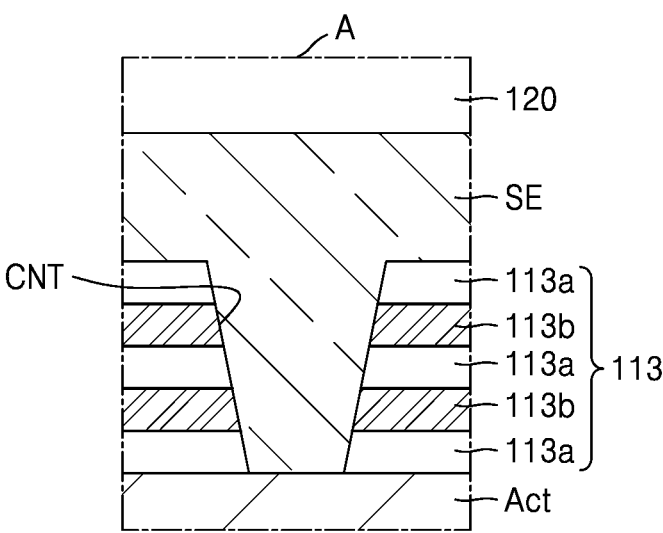
FIG. 3 is an enlarged schematic cross-sectional view of region A of FIG. 2.

FIG. 3 is an enlarged schematic cross-sectional view of region A of FIG. 2. In detail, FIG. 3 is a schematic cross-sectional view illustrating that the interlayer insulating layer 113 is provided as multiple layers, and is an enlarged schematic cross-sectional view of region A of FIG. 2.

Referring to FIGS. 2 and 3, the interlayer insulating layer 113 may include multiple silicon oxide layers 113*a* and multiple silicon nitride layers 113*b*. For example, as illustrated in FIG. 3, the interlayer insulating layer 113 may have a structure in which the silicon oxide layers 113*a* and the silicon nitride layers 113*b* are alternately stacked each other. In FIG. 3, three silicon oxide layers 113*a* and two silicon nitride layers 113*b* are alternately stacked each other, but the disclosure is not limited thereto. In another embodiment, two silicon oxide layers 113*a* and one silicon nitride layers 113*b* may be alternately stacked each other, or five silicon oxide layers 113*a* and three silicon nitride layers 113*b* may be alternately stacked each other.

Referring back to FIG. 2, a contact hole CNT may be defined in the interlayer insulating layer 113. The contact hole CNT defined in the interlayer insulating layer 113 may defined through the interlayer insulating layer 113 in a thickness direction of the substrate 100. At least a portion of the semiconductor layer Act may be exposed through the contact hole CNT defined in the interlayer insulating layer 113. The contact hole CNT defined in the interlayer insulating layer 113 may be formed by removing a portion of the interlayer insulating layer 113. This will be described in detail with reference to FIGS. 7 and 8.

In an embodiment, the connection electrode may be disposed on the interlayer insulating layer 113. The connection electrode may include the source electrode SE and the drain electrode DE. The source electrode SE and/or the drain electrode DE may be electrically connected to the semiconductor layer Act through the contact hole CNT defined in the interlayer insulating layer 113. The source electrode SE and the drain electrode DE may include Al, Pt, Pd, Ag, Mg, Au, Ni, Nd, Ir, Cr, Li, Ca, Mo, Ti, W, Cu, or the like, and may be formed as a single layer or multiple layers including one or more of the materials. For example, the source electrode SE and the drain electrode DE may include a triple layer of titanium, aluminum, and titanium (Ti/Al/Ti).

An organic insulating layer 120 may be disposed on the source electrode SE and the drain electrode DE. The organic insulating layer 120 may include a single layer or multiple layers including an organic material, and may provide a planar top surface. The organic insulating layer 120 may include a general-purpose polymer such as benzocyclobutene (BCB), polyimide, hexamethyldisiloxane (HMDSO), polymethylmethacrylate (PMMA), or polystyrene (PS), a polymer derivative having a phenolic group, an acrylic polymer, an imide-based polymer, an aryl ether-based polymer, an amide-based polymer, a fluorine-based polymer, a p-xylene-based polymer, a vinyl alcohol-based polymer, and a blend thereof.

The light-emitting device OLED may be disposed on the organic insulating layer 120. The light-emitting diode OLED may include a first electrode 160, an emission layer 170, and a second electrode 180. The first electrode 160 may be an anode, and the second electrode 180 may be a cathode. However, the disclosure is not limited thereto.

The first electrode 160 may be disposed on the organic insulating layer 120. Although not illustrated, the first electrode 160 may be electrically connected to the connection electrode through a via hole defined in the organic insulating layer 120. Accordingly, the thin-film transistor TFT may be electrically connected to the light-emitting device OLED.

The first electrode 160 may be a (semi)transmissive electrode or a reflective electrode. In an embodiment, the first electrode 160 may include a reflective layer including Ag, Mg, Al, Pt, Pd, Au, Ni, Nd, Ir, Cr, or a compound thereof, and a transparent or translucent layer formed on the reflective layer. The transparent or translucent layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO). For example, the first electrode 160 may include ITO/Ag/ITO.

A pixel defining layer 130 having an opening OP defined therein and exposing at least a portion of the first electrode 160 may be disposed on the first electrode 160. An emission region of the light-emitting device OLED may be defined by the opening OP defined in the pixel defining layer 130. For example, a size or width of the opening OP defined in the pixel defining layer 130 may correspond to a size or width of the emission region.

The pixel defining layer 130 may increase a distance between the first electrode 160 and the second electrode 180 to prevent an arc or the like at the edge of the first electrode 160. The pixel defining layer 130 may include at least one organic insulating material selected from the group consisting of polyimide, polyamide, acrylic resin, BCB, and phenol resin, and may be formed by spin coating or the like.

The emission layer 170 may be disposed on the first electrode 160. The emission layer 170 may be disposed in the opening OP defined in the pixel defining layer 130. The emission layer 170 may include a polymer organic material or a low molecular weight organic material, which emits light of a certain color. In another embodiment, the emission layer 170 may include an inorganic light-emitting material or quantum dots.

Although not illustrated, a first functional layer may be provided under the emission layer 170, and a second functional layer may be provided above the emission layer 170. The first functional layer may include, for example, a hole transport layer (HTL) and/or a hole injection layer (HIL). The second functional layer may include an electron transport layer (ETL) and/or an electron injection layer (EIL). However, the disclosure is not limited thereto. The first functional layer and/or the second functional layer may be a common layer formed to completely cover the substrate 100, like the second electrode 180 to be described later.

Although not illustrated, the light-emitting device OLED may include multiple emission layers 170, and functional layers such as an HTL, a hole-generating layer, an electron-generating layer, an ETL, etc. may be arranged between the emission layers 170.

The second electrode 180 may be disposed on the first electrode 160 and may overlap the first electrode 160. The second electrode 180 may include a conductive material having a low work function. For example, the second electrode 180 may include a (semi)transparent layer including Ag, Mg, Al, Pt, Pd, Au, Ni, Nd, Ir, Cr, Li, Ca, or an alloy thereof. In another embodiment, the second electrode 180 may further include a layer such as ITO, IZO, ZnO or $In_2O_3$ on the (semi)transparent layer including the above-described material. The second electrode 180 may be formed as a single body to cover the entire substrate 100.

Although not illustrated, an encapsulation member may be disposed on the light-emitting device OLED. For example, a thin-film encapsulation layer or an encapsulation substrate may be disposed on the light-emitting device OLED. In case that the thin-film encapsulation layer is disposed on the light-emitting device OLED, the thin-film encapsulation layer may include at least one inorganic layer and at least one organic layer.

FIGS. 4 to 13 are schematic cross-sectional views of a method of manufacturing a display apparatus, according to an embodiment. FIGS. 4 to 13 are schematic cross-sectional views of a display apparatus, and some members thereof may be omitted here.

Referring to FIGS. 4 to 13, a method of manufacturing a display apparatus may include forming the semiconductor layer Act on the substrate 100, forming the interlayer insulating layer 113 on the semiconductor layer Act, forming a photoresist pattern PR on the interlayer insulating layer 113, forming, by etching the interlayer insulating layer 113, a contact hole CNT exposing at least a portion of the semiconductor layer Act, and performing, by using a cleaning gas including a fluorine-containing gas and a hydrogen-containing gas, a primary cleaning of the interlayer insulating layer 113, in which the contact hole CNT is formed.

Figure 4:
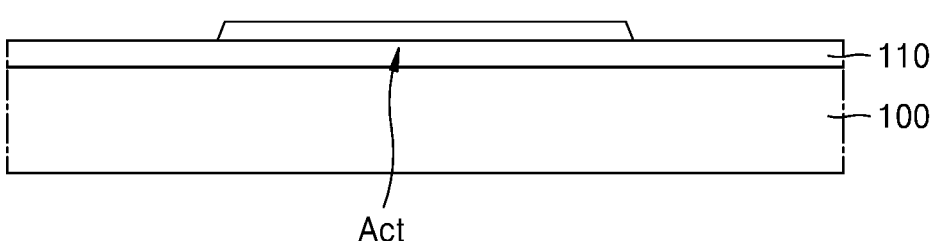
FIGS. 4 to 13 are schematic cross-sectional views of a method of manufacturing a display apparatus, according to an embodiment.

First, referring to FIG. 4, the buffer layer 110 may be formed on the substrate 100, and the semiconductor layer Act may be formed on the buffer layer 110. The substrate 100 may include a material such as glass, metal, or plastic. The buffer layer 110 may include an inorganic material and may be provided as a single layer or multiple layers. The semiconductor layer Act may include at least one of an oxide semiconductor material and a silicon semiconductor material.

Figure 5:
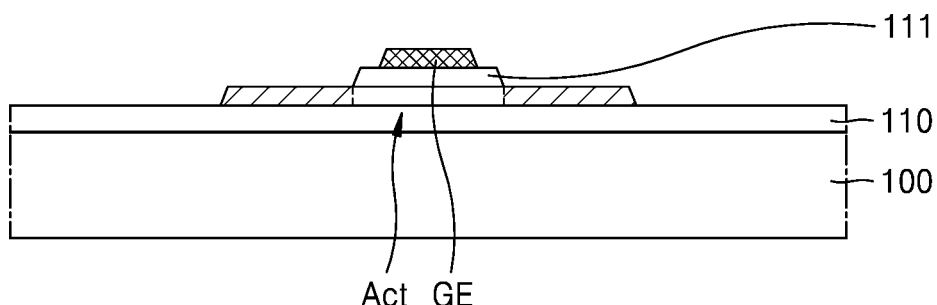

Referring to FIG. 5, the gate insulating layer 111 may be formed on the semiconductor layer Act, and the gate electrode GE may be formed on the gate insulating layer 111. As described above, the gate electrode GE and the semiconductor layer Act may overlap each other with the gate insulating layer 111 therebetween. The gate insulating layer 111 may be patterned to correspond to the gate electrode GE disposed thereon. However, the disclosure is not limited thereto.

Figure 6:
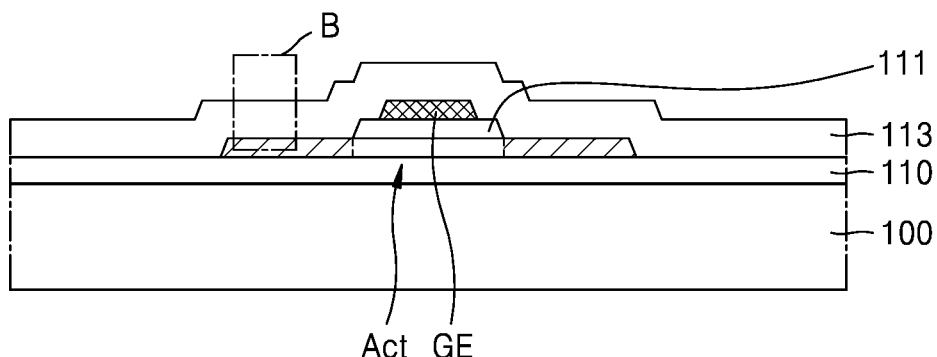

Referring to FIG. 6, the interlayer insulating layer 113 may be formed on the semiconductor layer Act. For example, the interlayer insulating layer 113 may be formed on the gate electrode GE, the gate insulating layer 111, the semiconductor layer Act, and the buffer layer 110. The interlayer insulating layer 113 may cover the gate electrode GE, the gate insulating layer 111, the semiconductor layer Act, and the buffer layer 110.

In an embodiment, the interlayer insulating layer 113 may include a silicon insulating layer. For example, the interlayer insulating layer 113 may include silicon oxide and/or silicon nitride.

Figure 7:
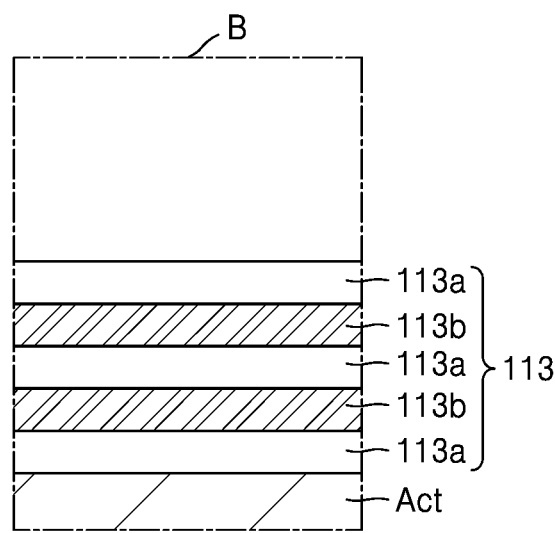

FIG. 7 is an enlarged schematic cross-sectional view of region B of FIG. 6.

Referring to FIG. 7, the interlayer insulating layer 113 may include multiple silicon oxide layers 113a and multiple silicon nitride layers 113b. For example, the interlayer insulating layer 113 may have a structure in which the silicon oxide layers 113a and the silicon nitride layers 113b are alternately stacked each other.

Figure 8:
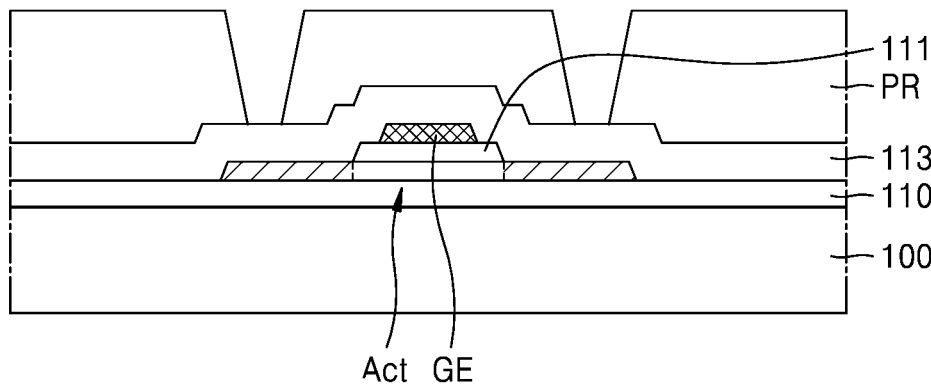

Referring to FIG. 8, the photoresist pattern PR may be formed on the interlayer insulating layer 113. The photoresist pattern PR may be formed on the interlayer insulating layer 113 through a following process.

First, a photoresist may be coated on an entire surface of the interlayer insulating layer 113, and an exposure process may be performed using a photomask. A density of a portion of the photoresist PR exposed to light may be different from that of a portion thereof not exposed to light. The photoresist overlapping a portion where a contact hole is to be formed may be removed through a developing process using a developer. The photoresist may include a positive type and a negative type. In the positive type, a portion exposed to light may be removed, and in the negative type, a portion not exposed to light may be removed. Accordingly, the photoresist pattern PR may be formed on the interlayer insulating layer 113, but the photoresist pattern PR may not overlap a portion of the interlayer insulating layer 113 where a contact hole is to be formed, and may overlap the remaining portions of the interlayer insulating layer 113.

Figure 9:
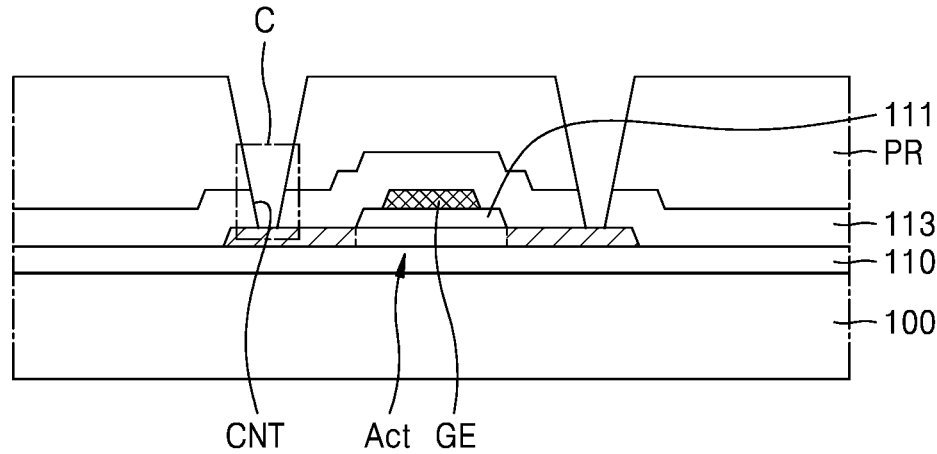
Figure 10:
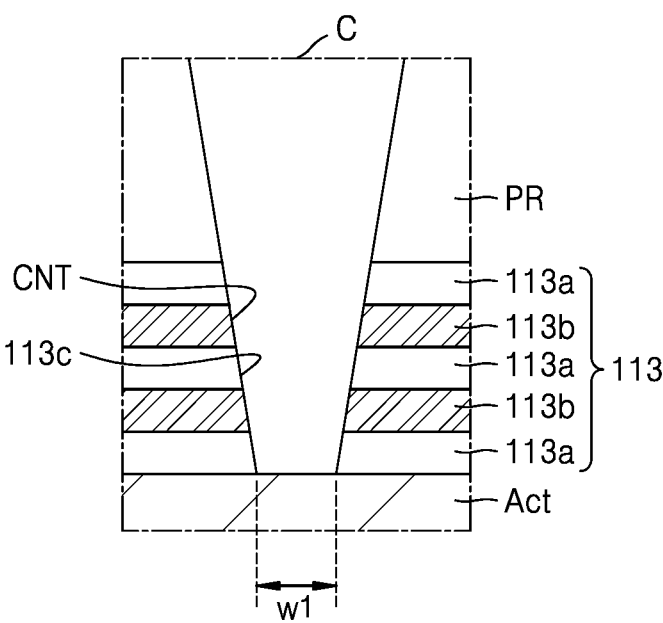

FIG. 10 is an enlarged schematic cross-sectional view of region C of FIG. 9.

Referring to FIGS. 9 and 10, the contact hole CNT exposing at least a portion of the semiconductor layer Act may be formed by etching the interlayer insulating layer 113. The contact hole CNT may be formed by etching a portion of the interlayer insulating layer 113. The photoresist pattern PR may be used as a mask. At least a portion of the semiconductor layer Act may be exposed through the contact hole CNT.

In an embodiment, a width w1 of the contact hole CNT may be about 2 μm. For example, the width w1 of the contact hole CNT may be a lower reference diameter or a lower reference width or size of the contact hole CNT.

A dry etching method may be used to etch the interlayer insulating layer 113. When the interlayer insulating layer 113 is etched, an etching gas capable of etching both the silicon oxide layers 113a and the silicon nitride layers 113b may be used. For example, an etching gas such as $CF_4$, $SF_6$, $BCl_3$, $Cl_2$, Ar, or $O_2$ may be used for etching the interlayer insulating layer 113.

When the interlayer insulating layer 113 is etched, a portion of the photoresist pattern PR formed on the interlayer insulating layer 113 may be chemically or physically decomposed, and accordingly, a residue of the photoresist pattern PR may remain on a side wall 113c of the interlayer insulating layer 113 defining the contact hole CNT and/or in the contact hole CNT. A thickness of the residue of the photoresist on the sidewall 113c of the interlayer insulating layer 113 may be about 20 nm to about 80 nm.

Figure 11:
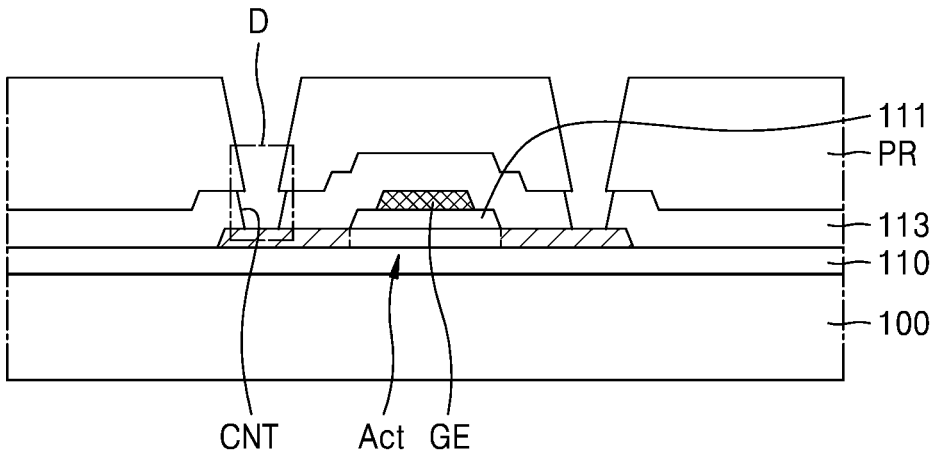
Figure 12:
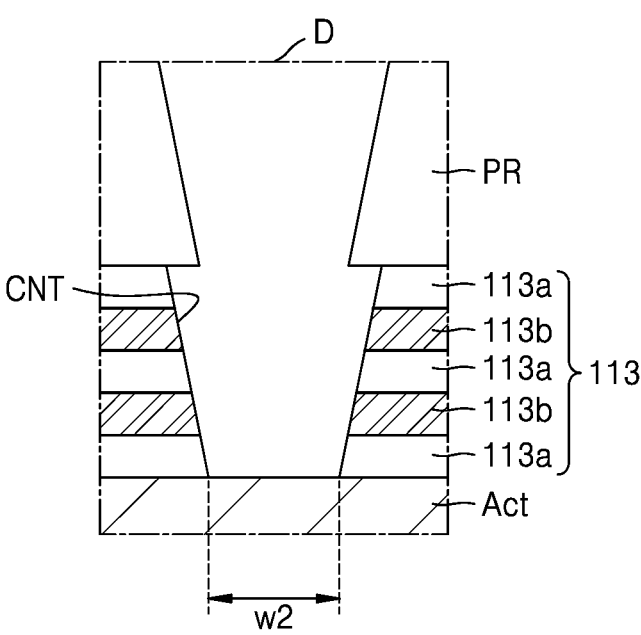
Figure 13:
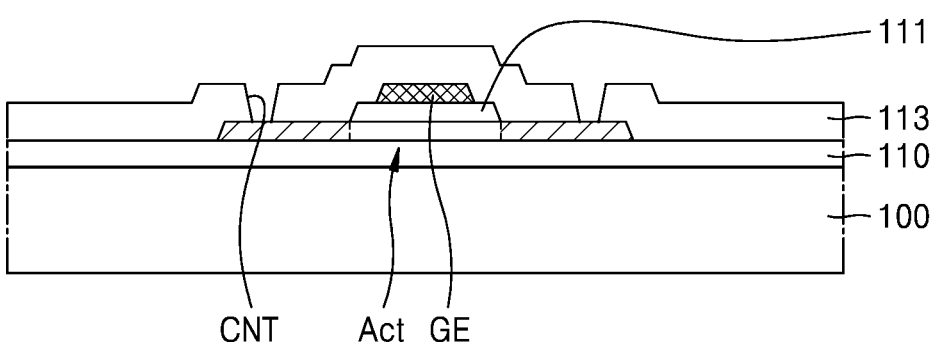

FIG. 12 is an enlarged view of region D of FIG. 11.

Referring to FIGS. 11 and 12, after the contact hole CNT is formed, an operation of cleaning the interlayer insulating layer 113 (for example, a primary cleaning operation) may be performed. For example, the interlayer insulating layer 113 may undergo a primary cleaning. For example, the interlayer insulating layer 113 in which the contact hole CNT is formed may be primarily cleaned using a cleaning gas including a fluorine-containing gas and a hydrogen-containing gas.

In an embodiment, the cleaning gas may include a fluorine-containing gas and a hydrogen-containing gas. The fluorine-containing gas may include at least one of hydrofluoric acid gas and nitrogen trifluoride gas. The hydrogen-containing gas may include at least one of ammonia gas and hydrogen gas. The fluorine-containing gas and the hydrogen-containing gas may be provided in a flow rate ratio of about 0.5:1 to about 1:0.5. In another embodiment, the fluorine-containing gas and the hydrogen-containing gas may be provided in a flow rate ratio of about 0.8:1 to about 1:0.8. In still another embodiment, the fluorine-containing gas and the hydrogen-containing gas may be provided in a flow rate ratio of about 1:1. In case that a content of the fluorine-containing gas is relatively small, an etching amount of silicon oxide and an etching amount of silicon nitride may be reduced. Even in case that the content of the fluorine-containing gas increases, the etching amount of silicon nitride may not be increased but may be saturated. Thus, in case that a flow rate ratio of the fluorine-containing gas and the hydrogen-containing gas satisfies the above-described range, a difference between the etching amount of silicon oxide and the etching amount of silicon nitride may be reduced, and a difference between an etching rate of silicon oxide and an etching rate of silicon nitride may satisfy about 5% or less.

The cleaning gas may be supplied into a reaction chamber together with an inert gas. Argon gas may be used as the inert gas. The inert gas may be supplied at a flow rate of about 2 times to about 8 times of a flow rate of the fluorine-containing gas. The cleaning gas may be plasmarized remotely or inside the reaction chamber and may be provided to the interlayer insulating layer 113.

In an embodiment, at least a portion of the interlayer insulating layer 113 may be etched in the primary cleaning operation. For example, in the primary cleaning operation, at least a portion of each of the silicon oxide layers 113a and of each of the silicon nitride layers 113b included in the interlayer insulating layer 113 may be etched.

In an embodiment, in the primary cleaning operation, the interlayer insulating layer 113 may be etched by about 10 nm to about 500 nm. Thus, a width w2 of the contact hole CNT after performing the primary cleaning operation (see FIG. 12) may be greater than the width w1 of the contact hole CNT before performing the primary cleaning operation (see FIG. 10). For example, etching of about 0.1 μm may be performed radially through the primary cleaning operation. Thus, the width w1 of the contact hole CNT before performing the primary cleaning operation may be about 2 μm, and the width w2 of the contact hole CNT after performing the primary cleaning operation may be about 2.2 μm. The etching amount in the primary cleaning operation may vary depending on process conditions such as a flow rate of a cleaning gas, process temperature, and a process pressure. This will be described later.

The etching in the primary cleaning operation may be due to a salt reaction by hydrofluoric acid as follows.

1) $HF+NH_3 \rightarrow NH_4F$
2) $6NH_4F+SiO_2 \rightarrow (NH_4)_2SiF_6+2H_2O+4NH_3$ By such a salt reaction, a surface state of the sidewall 113c of the interlayer insulating layer 113 defining the contact hole CNT may be improved, and a width of the contact hole CNT may be increased, and a residue of the photoresist in the contact hole CNT may be removed.

In an embodiment, a difference between an etch rate of the silicon oxide layers 113a and an etch rate of the silicon nitride layers 113b in the primary cleaning operation may be about 5% or less. In case that the primary cleaning operation is performed using a cleaning gas having a high etching selectivity with respect to the silicon oxide layers 113a and the silicon nitride layers 113b, etching may be concentrated on either silicon oxide or silicon nitride, and a surface of the sidewall 113c of the interlayer insulating layer 113 defining the contact hole CNT may be uneven, which may cause a disconnection in the connection electrode (for example, a source electrode and/or a drain electrode) disposed in the contact hole CNT and may increase the contact resistance.

However, the inventors of the disclosure have found, through repeated experiments, that a difference between the etch rate of the silicon oxide layers 113a and the etch rate of the silicon nitride layers 113b may be set to 5% or less by controlling process conditions such as process time (or cleaning time), process gas (or cleaning gas), process temperature (or substrate temperature), and process pressure.

Figure 14:
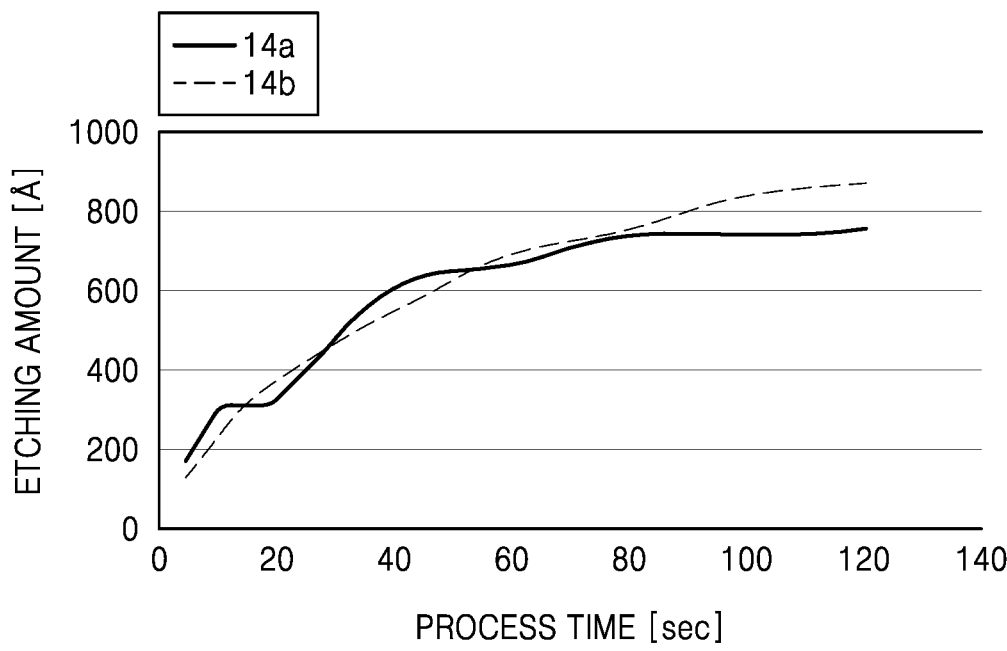
FIG. 14 is a graph showing a result of measuring an etching amount of silicon oxide and an etching amount of silicon nitride, according to process time.

FIG. 14 is a graph showing a result of measuring an etching amount of silicon oxide and an etching amount of silicon nitride, according to process time. In FIG. 14, 14a shows an etching amount of silicon oxide according to the process time (or cleaning time), and 14b shows an etching amount of silicon nitride according to the process time (or cleaning time). In FIG. 14, the etching amount was measured through SEM photographic analysis.

Process conditions other than the process time (or cleaning time) were fixed, and the process conditions were as follows:

1) $HF:NH_3$ flow rate ratio: 1:1 (HF: 75 sccm)
2) HF:Ar flow rate ratio: 1:3
3) process pressure: 2000 mTorr
4) process temperature (or substrate temperature): 70° C.

Referring to FIG. 14, it can be seen that the etching amount of silicon oxide (14a) and the etching amount of silicon nitride (14b) increase as the primary cleaning proceeds. However, the etching amount of silicon oxide (14a) does not increase any more after about 80 seconds, but the etching amount of silicon nitride (14b) continues to increase until about 120 seconds.

In an embodiment, the process time (or cleaning time) during which the primary cleaning operation is performed may be about 20 seconds to about 80 seconds. In case that the process time (or cleaning time) during which the primary cleaning operation is performed is less than about 20 seconds, the amounts of silicon oxide and silicon nitride to be etched is small, and photoresist residues remaining in the contact hole CNT may not be completely removed. On the other hand, in case that the process time (or cleaning time) during which the primary cleaning operation is performed is more than about 80 seconds, a difference between the etching amount of silicon oxide (14a) and the etching amount of silicon nitride (14b) increases, and thus, a difference between the etch rate of silicon nitride and the etch rate of silicon nitride may increase. Thus, as the primary cleaning operation is performed for about 20 seconds to about 80 seconds, the difference between the etching amount of silicon oxide (14a) and the etching amount of silicon nitride (14b) may be reduced, and a difference between the etching rate of silicon oxide and the etching rate of silicon nitride may be about 5% or less.

Figure 15:
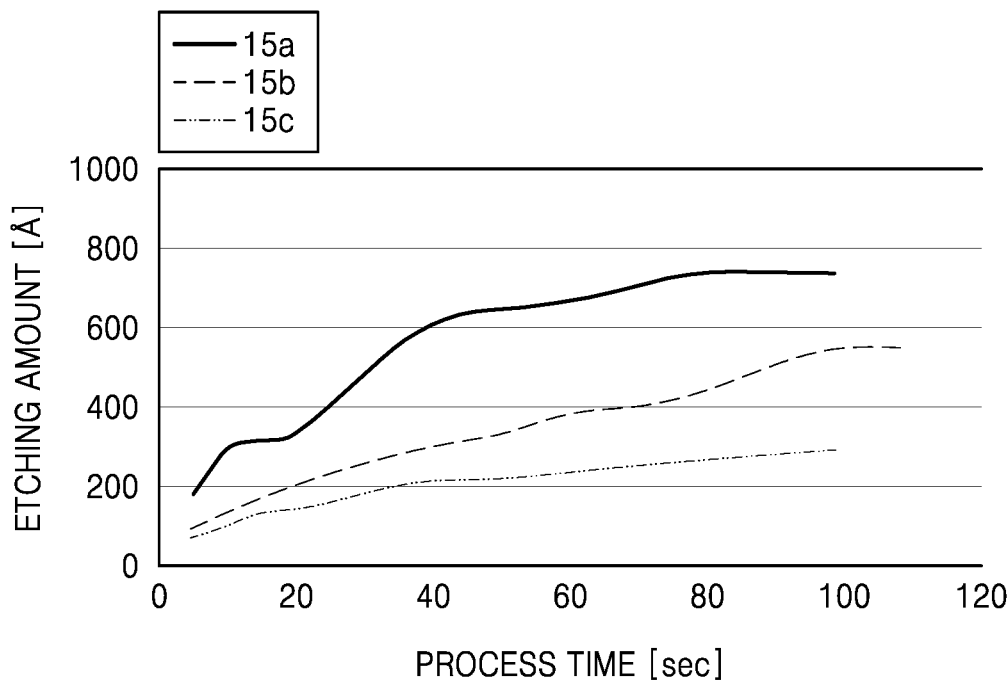
FIG. 15 is a graph showing a result of measuring an etching amount of silicon oxide according to process time and process temperature.

FIG. 15 is a graph showing a result of measuring an etching amount of silicon oxide according to process time and process temperature. In FIG. 15, 15a shows an etching amount of silicon oxide according to process time (or cleaning time) in case that the process temperature (or substrate temperature) is 70° C., 15b shows an etching amount of silicon oxide according to process time (or cleaning time) in case that the process temperature (or substrate temperature) is 80° C., and 15*c* shows an etching amount of silicon oxide according to the process time (or cleaning time) in case that the process temperature (or substrate temperature) is 90° C. In FIG. 15, the etching amount was measured through SEM photographic analysis.

Other process conditions than the process time (or cleaning time) and the process temperature (or substrate temperature) were fixed, and the process conditions were as below.

1) $HF:NH_3$ flow rate ratio: 1:1 (HF: 75 sccm)

2) HF:Ar flow rate ratio: 1:3

3) process pressure: 2000 mTorr

Referring to FIG. 15, during a same time period, when cleaning of silicon oxide is performed, the etching amount was the most at a process temperature (or substrate temperature) of 70° C. and the least at a process temperature (or substrate temperature) of 90° C. For example, the higher the process temperature (substrate temperature), the smaller the amount of silicon oxide being etched.

Figure 16:
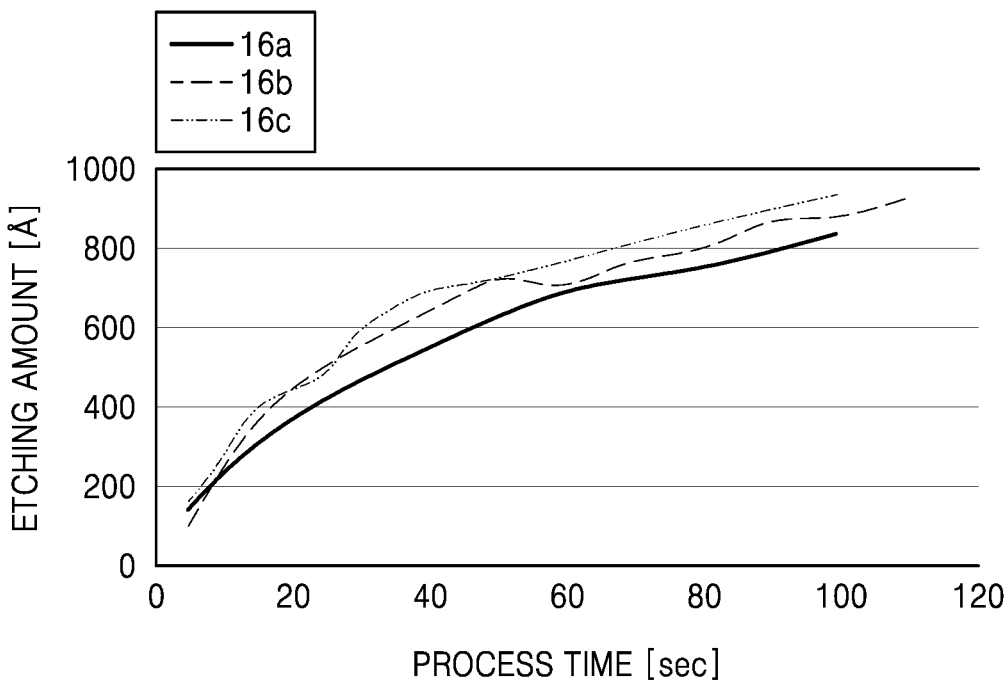
FIG. 16 is a graph showing a result of measuring an etching amount of silicon nitride according to process time and process temperature.

FIG. 16 is a graph showing a result of measuring an etching amount of silicon nitride according to process time and process temperature. In FIG. 16, 16*a* shows an etching amount of silicon nitride according to the process time (or cleaning time) in case that the process temperature (or substrate temperature) is 70° C., 16*b* shows an etching amount of silicon nitride according to the process time (or cleaning time) in case that the process temperature (or substrate temperature) is 80° C., and 16*c* shows an etching amount of silicon nitride according to the process time (or cleaning time) in case that the process temperature (or substrate temperature) is 90° C. In FIG. 16, the etching amount was measured through SEM photographic analysis.

Other process conditions than the process time (or cleaning time) and the process temperature (or substrate temperature) were fixed, and the process conditions were as below.

1) $HF:NH_3$ flow rate ratio: 1:1 (HF: 75 sccm)

2) HF:Ar flow rate ratio: 1:3

3) process pressure: 2000 mTorr

Referring to FIG. 16, during a same time period, when cleaning of silicon nitride is performed, the etching amount was the least at a process temperature (or substrate temperature) of 70° C. and the most at a process temperature (or substrate temperature) of 90° C. For example, the higher the process temperature (substrate temperature), the greater the amount of silicon nitride being etched.

Figure 17:
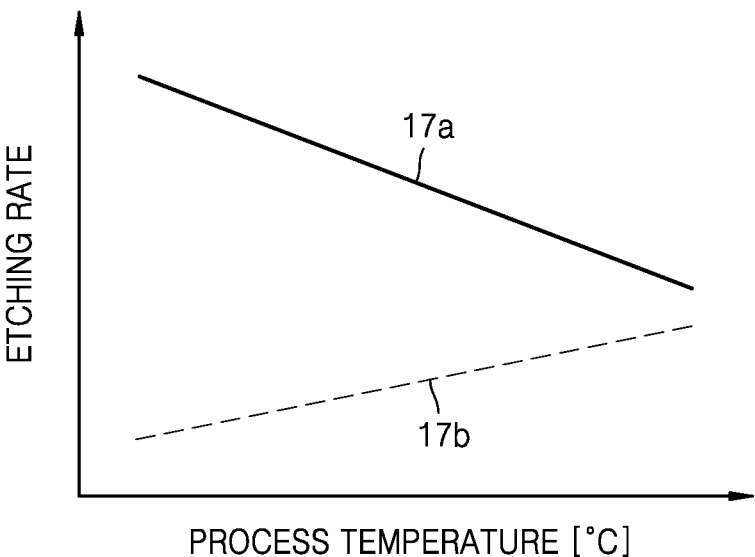
FIG. 17 is a graph schematically showing a change in each of an etching rate of silicon oxide and an etching rate of silicon nitride according to process temperature.

FIG. 17 is a graph schematically showing a change in each of an etching rate of silicon oxide and an etching rate of silicon nitride, according to process temperature. For example, FIG. 17 is a graph schematically showing changes in the etch rate of silicon oxide and the etch rate of silicon nitride according to process temperature (or substrate temperature) based on the results of FIGS. 15 and 16.

Referring to FIGS. 15, 16, and 17, the etch rate of silicon oxide decreases as the process temperature (or substrate temperature) increases, but the etching rate of silicon nitride increases as the process temperature (or substrate temperature) increases. Also, it can be seen that a difference between the etch rate of silicon oxide and the etch rate of silicon nitride at a relatively low temperature is greater than a difference between the etch rate of silicon oxide and the etch rate of silicon nitride at a relatively high temperature.

In an embodiment, the process temperature (or substrate temperature) at which the primary cleaning operation is performed may be about 30° C. to about 90° C. In case that the process temperature (or substrate temperature) at which the primary cleaning operation is performed is less than about 30° C. or greater than about 90° C., the difference between the etching amount of silicon oxide and the etching amount of silicon nitride increases, and accordingly, the difference between the etch rate of silicon nitride and the etch rate of silicon nitride may increase. Thus, as the primary cleaning operation is performed at the process temperature (or substrate temperature) in a range of about 30° C. to about 90° C., the difference between the etching amount of silicon oxide and the etching amount of silicon nitride may be reduced, and accordingly, a difference between the etching rate of silicon oxide and the etching rate of silicon nitride may be about 5% or less.

Figure 18:
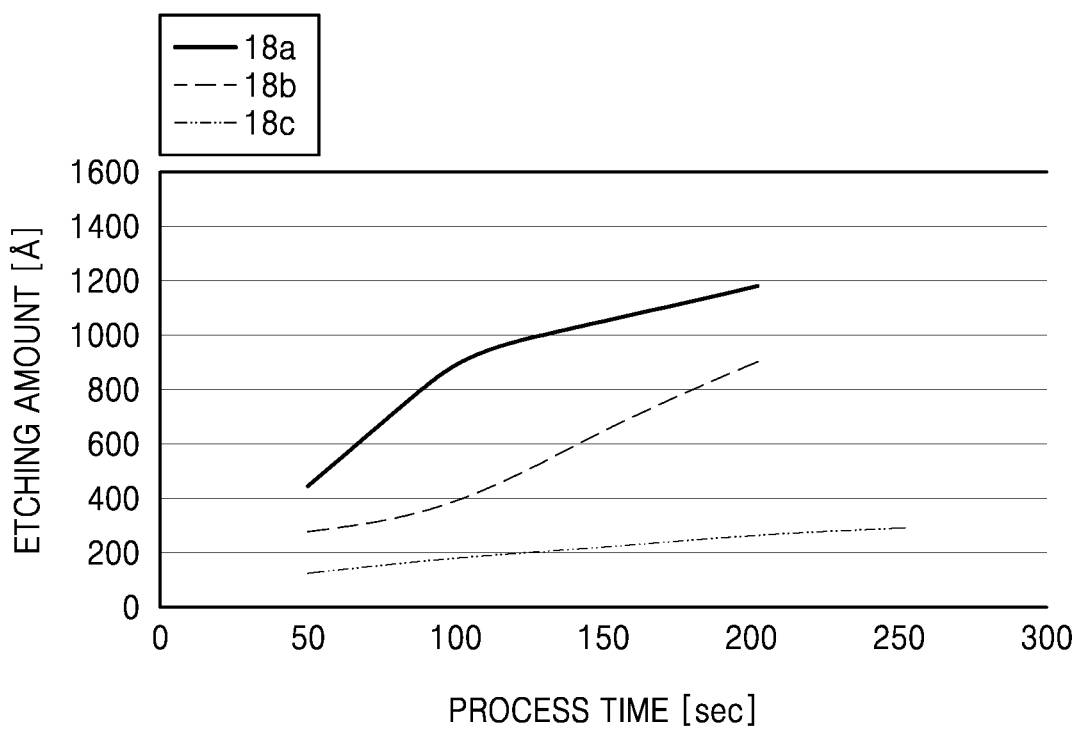
FIG. 18 is a graph showing a result of measuring an etching amount of silicon oxide according to process time and a flow rate of hydrofluoric acid gas.

FIG. 18 is a graph showing a result of measuring an etching amount of silicon oxide according to process time and a flow rate of hydrofluoric acid gas. In FIG. 18, 18*a* shows an etching amount of silicon oxide according to the process time (or cleaning time) in case that the flow rate of hydrofluoric acid gas in a cleaning gas is 75 sccm, 18*b* shows an etching amount of silicon oxide according to the process time (or cleaning time) in case that the flow rate of hydrofluoric acid gas in the cleaning gas is 50 sccm, and 18*c* shows an etching amount of silicon oxide according to the process time (or cleaning time) in case that the flow rate of hydrofluoric acid gas in the cleaning gas is 25 sccm. In FIG. 18, the etching amount was measured through SEM photographic analysis.

Process conditions other than the process time (or cleaning time) and the flow rate of hydrofluoric acid gas were fixed, and the process conditions were as follows:

1) $HF:NH_3$ flow rate ratio: 1:1

2) Ar: 200 sccm 3) process pressure: 2000 mTorr 4) process temperature (or substrate temperature): 80° C.

Referring to FIG. 18, it can be seen that the etching amount of silicon oxide increases as the flow rate of hydrofluoric acid gas increases. In case that the flow rate of hydrofluoric acid gas is 25 sccm, a difference in the etching amount according to the process time (or cleaning time) is not large and is almost the same, and in case that the flow rate of hydrofluoric acid gas is 50 sccm or 75 sccm, the difference in the etching amount according to the process time (or the cleaning time) is relatively large. For example, the etching amount of silicon oxide increases as the flow rate of hydrofluoric acid gas increases.

Figure 19:
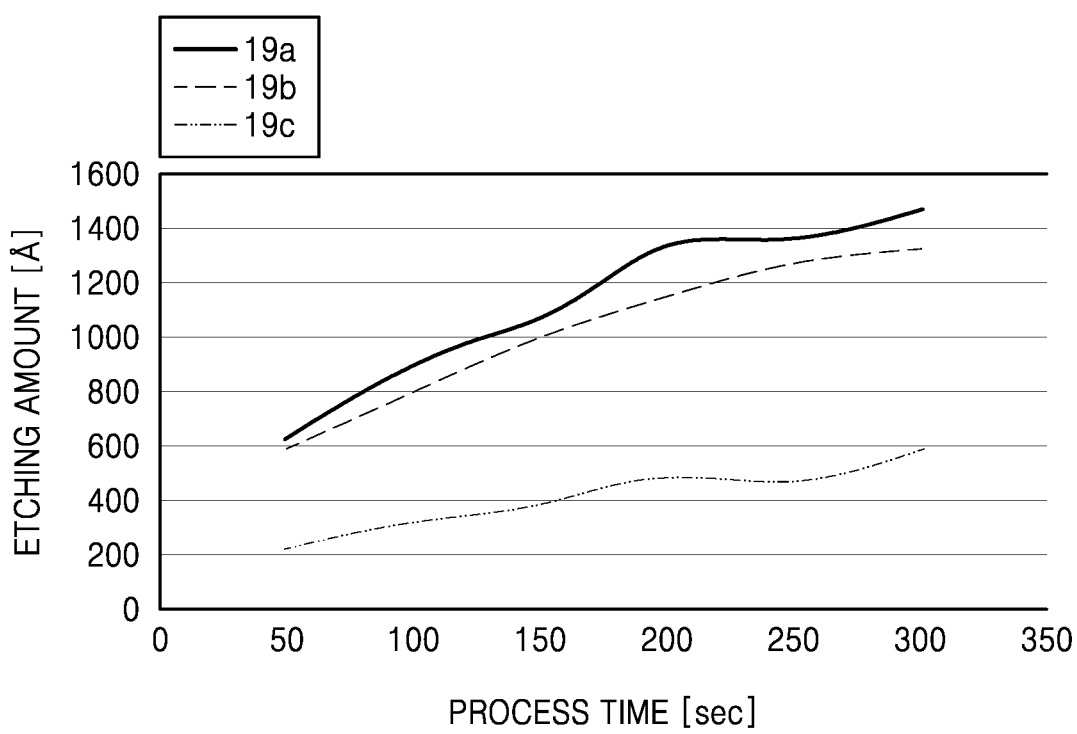
FIG. 19 is a graph showing a result of measuring an etching amount of silicon nitride according to process time and a flow rate of a hydrofluoric acid gas.

FIG. 19 is a graph showing a result of measuring an etching amount of silicon nitride according to process time and a flow rate of hydrofluoric acid gas. In FIG. 19, 19*a* shows an etching amount of silicon nitride according to the process time (or cleaning time) in case that the flow rate of hydrofluoric acid gas in the cleaning gas is 75 sccm, 19*b* shows an etching amount of silicon nitride according to the process time (or cleaning time) in case that the flow rate of hydrofluoric acid gas in the cleaning gas is 50 sccm, and 19*c* shows an etching amount of silicon nitride according to the process time (or cleaning time) in case that the flow rate of hydrofluoric acid gas in the cleaning gas is 25 sccm. In FIG. 19, the etching amount was measured through SEM photographic analysis.

Process conditions other than the process time (or cleaning time) and the flow rate of hydrofluoric acid gas were fixed, and the process conditions were as follows:

1) $HF:NH_3$ flow rate ratio: 1:1

2) Ar: 200 sccm 3) process pressure: 2000 mTorr 4) process temperature (or substrate temperature): 80° C.

Referring to FIG. 19, it can be seen that the etching amount of silicon nitride increases as the flow rate of hydrofluoric acid gas increases. Also, it can be seen that a difference in the etching amount of silicon nitride in case that the flow rate of hydrofluoric acid gas is 50 sccm and the flow rate of hydrofluoric acid gas is 75 sccm is not great. For example, the etching amount of a silicon nitride layer nears saturation at the flow rate of hydrofluoric acid gas of 50 sccm or higher.

Figure 20:
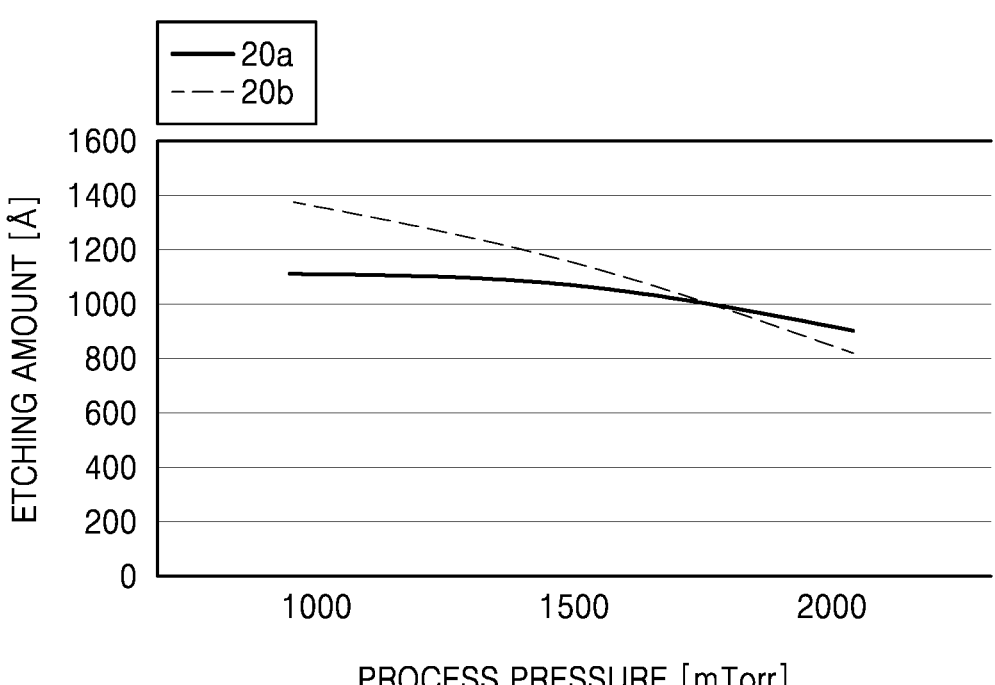
FIG. 20 is a graph showing a result of measuring an etching amount of silicon oxide and an etching amount of silicon nitride, according to process pressure.

FIG. 20 is a graph showing a result of measuring an etching amount of silicon oxide and an etching amount of silicon nitride, according to a process pressure. In FIG. 20, 20a shows an etching amount of silicon oxide according to a process pressure, and 20b shows an etching amount of silicon nitride according to a process pressure. In FIG. 20, the etching amount was measured through SEM photographic analysis.

Process conditions other than the process pressure were fixed, and the process conditions were as follows:
1) $HF:NH_3$ flow rate ratio: 1:1 (HF: 75 sccm)
2) Ar: 200 sccm
3) process temperature (or substrate temperature): 80° C.
4) process time (or cleaning time): 80 seconds Referring to FIG. 20, it can be seen that the etching amount of silicon oxide and the etching amount of silicon nitride decrease as the process pressure increases. However, in case that the process pressure is 1000 mTorr, the etching amount of silicon nitride is greater than the etching amount of silicon oxide, but in case that the process pressure is 2000 mTorr, the etching amount of silicon nitride is less than the etching amount of silicon oxide. For example, as the process pressure increases, both the etching amount of silicon nitride and the etching amount of silicon oxide decrease, but the etching amount of silicon nitride is reduced significantly more compared to that of silicon oxide.

In an embodiment, the process pressure at which a primary cleaning operation is performed may be between about 1500 mTorr and about 2000 mTorr. In case that the process pressure at which the primary cleaning operation is performed is less than about 1500 mTorr and/or greater than about 2000 mTorr, a difference between the etching amount of silicon oxide and the etching amount of silicon nitride increases, and thus, a difference between the etch rate of silicon oxide and the etch rate of silicon nitride may increase. Thus, as the primary cleaning operation is performed at the process pressure between about 1500 mTorr and about 2000 mTorr, a difference between the etching amount of silicon oxide and the etching amount of silicon nitride may be reduced, and accordingly, a difference between the etching rate of silicon oxide and the etching rate of silicon nitride may be about 5% or less.

In an embodiment, in case that the cleaning gas used in the primary cleaning operation includes hydrofluoric acid gas and ammonia gas, a flow rate ratio of hydrofluoric acid gas to ammonia gas satisfies about 0.8:1 to about 1:0.8, the primary cleaning operation is performed under process conditions of process time (or cleaning time) of about 20 seconds to about 80 seconds, a process temperature (or substrate temperature) of about 30° C. to about 90° C., and a process pressure of about 1500 mTorr to about 2000 mTorr, the difference between the etching amount of silicon oxide and the etching amount of silicon nitride may be reduced. The difference between the etch rate of silicon oxide and the etch rate of silicon nitride may be about 5% or less.

As the difference between the etch rate of silicon oxide and the etch rate of silicon nitride is reduced, a surface condition of the sidewall 113c of the interlayer insulating layer 113 defining the contact hole CNT may be improved, thereby preventing or minimizing defects such as disconnections.

Referring back to FIG. 13, after the primary cleaning operation is performed, a secondary cleaning of the interlayer insulating layer 113 and the contact hole CNT, on which the primary cleaning operation is performed, may be performed. In the secondary cleaning operation, the interlayer insulating layer 113 and the contact hole CNT, which are cleaned once before, may be cleaned using pure water. For example, in the secondary cleaning operation, the interlayer insulating layer 113 and the contact hole CNT, on which the primary cleaning operation was performed, may be cleaned using ultrapure water. In the secondary cleaning operation, an HF salt reactant and residual fluorine produced from the primary cleaning operation may be removed.

In an embodiment, after the primary cleaning operation is performed, the secondary cleaning operation may be performed by a heat treatment method.

After the secondary cleaning operation is performed, an operation of removing the photoresist pattern PR formed on the interlayer insulating layer 113 may be performed. In the operation of removing the photoresist pattern PR, the photoresist pattern PR formed on the interlayer insulating layer 113 may be removed using a solution capable of selectively dissolving the photoresist (for example, AZ 910 available by Merck, etc.).

In an embodiment, after removing the photoresist pattern PR formed on the interlayer insulating layer 113, an operation of forming a connection electrode on the interlayer insulating layer 113 may be performed. For example, the source electrode SE (see FIG. 2) and the drain electrode DE (see FIG. 2), which are connection electrodes, may be formed on the interlayer insulating layer 113.

The organic insulating layer 120 (see FIG. 2) may be formed on the source electrode SE and the drain electrode DE, and the light-emitting device OLED (see FIG. 2) including the first electrode 160 (see FIG. 2), the emission layer 170 (see FIG. 2), and the second electrode 180 (see FIG. 2), may be formed on the organic insulating layer 120. For example, the organic insulating layer 120 may be formed on the source electrode SE and the drain electrode DE, the first electrode 160 may be formed on the organic insulating layer 120, the emission layer 170 may be formed on the first electrode 160, and the second electrode 180 may be formed on the emission layer 170. The pixel defining layer 130 having the opening OP defined therein and exposing at least a portion of the first electrode 160 may be formed on the first electrode 160.

After forming the contact hole CNT by etching a portion of the interlayer insulating layer 113 through dry etching, when the photoresist pattern PR formed on the interlayer insulating layer 113 is removed, and the interlayer insulating layer 113 is wet-cleaned, unwanted portions of on an upper surface of the interlayer insulating layer 113 may be etched, and etching by-products, salt-generating reactants, and photoresist residues may react with each other to generate a large amount of by-products.

In case that dry-cleaning the interlayer insulating layer 113 in which multiple silicon oxide layers and multiple silicon nitride layers are alternately stacked each other, etching may be concentrated on either silicon oxide or silicon nitride, and a surface of a sidewall of the interlayer insulating layer 113 defining a contact hole may be uneven, which may cause a disconnection in the connection electrode (for example, a source electrode and/or a drain electrode) disposed in the contact hole and may increase contact resistance.

In an embodiment, after the primary and secondary cleaning of the interlayer insulating layer 113 in which the contact hole CNT is formed, the photoresist pattern PR formed on the interlayer insulating layer 113 may be removed.

In case that the process conditions in the primary cleaning operation satisfy the above-mentioned conditions, the difference between the etching amount of silicon oxide and the etching amount of silicon nitride may be reduced. For example, in case that the cleaning gas used in the primary cleaning operation includes hydrofluoric acid gas and ammonia gas, and a flow rate ratio of hydrofluoric acid gas and ammonia gas satisfies about 0.8:1 to about 1:0.8, and the process time (or cleaning time), the process temperature (or the substrate temperature), and the process pressure satisfy the above-described conditions, the difference between the etching amount of silicon oxide and the etching amount of silicon nitride may be reduced. Thus, the difference between the etch rate of silicon oxide and the etch rate of silicon nitride may be about 5% or less.

According to the embodiments, a display apparatus and a method of manufacturing the display apparatus, in which damage to an insulating layer may be prevented or minimized by performing dry cleaning when forming a contact hole may be implemented. However, the scope of the disclosure is not limited by the above-described effects.

The above description is an example of technical features of the disclosure, and those skilled in the art to which the disclosure pertains will be able to make various modifications and variations. Therefore, the embodiments of the disclosure described above may be implemented separately or in combination with each other.

Therefore, the embodiments disclosed in the disclosure are not intended to limit the technical spirit of the disclosure, but to describe the technical spirit of the disclosure, and the scope of the technical spirit of the disclosure is not limited by these embodiments. The protection scope of the disclosure should be interpreted by the following claims, and it should be interpreted that all technical spirits within the equivalent scope are included in the scope of the disclosure.

What is claimed is:

1. A method of manufacturing a display apparatus, the method comprising:
   forming a semiconductor layer on a substrate;
   forming an insulating layer on the semiconductor layer;
   forming a photoresist pattern on the insulating layer;
   forming, by etching the insulating layer, a contact hole exposing at least a portion of the semiconductor layer; and
   performing a primary cleaning of the insulating layer in which the contact hole is formed, by using a cleaning gas including a fluorine-containing gas and a hydrogen-containing gas.

2. The method of claim 1, wherein the insulating layer has a structure in which a plurality of silicon oxide layers and a plurality of silicon nitride layers are alternately stacked each other.

3. The method of claim 2, wherein in the primary cleaning, at least a portion of the plurality of silicon oxide layers and at least a portion of the plurality of silicon nitride layers are etched.

4. The method of claim 3, wherein a width of the contact hole after the primary cleaning is performed is greater than a width of the contact hole before the primary cleaning is performed.

5. The method of claim 3, wherein in the primary cleaning, a difference between an etch rate of the plurality of silicon oxide layers and an etch rate of the plurality of silicon nitride layers is about 5% or less.

6. The method of claim 1, wherein in the primary cleaning,
   the fluorine-containing gas comprises at least one of hydrofluoric acid gas and nitrogen trifluoride gas, and
   the hydrogen-containing gas comprises at least one of ammonia gas and hydrogen gas.

7. The method of claim 6, wherein
   the cleaning gas comprises the hydrofluoric acid gas and the ammonia gas, and
   a flow rate ratio between the hydrofluoric acid gas and the ammonia gas is in a range of about 0.5:1 to about 1:0.5.

8. The method of claim 6, wherein the cleaning gas further includes an inert gas.

9. The method of claim 8, wherein the inert gas is provided at a flow rate in a range of about two times to about eight times of a flow rate of the fluorine-containing gas.

10. The method of claim 1, wherein the primary cleaning is performed at a process pressure in a range of about 1500 mTorr to about 2000 mTorr.

11. The method of claim 1, wherein the primary cleaning is performed at a process temperature in a range of about 30° C. to about 90° C.

12. The method of claim 1, wherein the primary cleaning is performed for between about 20 seconds and about 80 seconds.

13. The method of claim 1, further comprising, after the forming of the semiconductor layer on the substrate:
   forming a gate insulating layer on the semiconductor layer; and
   forming a gate electrode on the gate insulating layer.

14. The method of claim 1, further comprising, after the performing of the primary cleaning:
   performing, by using pure water, a secondary cleaning of the insulating layer in which the contact hole is formed and on which the primary cleaning has been performed; and
   removing the photoresist pattern from the insulating layer.

15. The method of claim 14, further comprising, after the removing of the photoresist pattern:
   forming a connection electrode on the insulating layer; and
   forming, on the connection electrode, a light-emitting device including a first electrode, an emission layer, and a second electrode.

16. A method of manufacturing a display apparatus, the method comprising:
   performing a primary cleaning of an insulating layer in which a contact hole is formed, by using a cleaning gas including a fluorine-containing gas and a hydrogen-containing gas; and
   performing, by using pure water, a secondary cleaning of the insulating layer in which the contact hole is formed and on which the primary cleaning has been performed,
   wherein the insulating layer has a structure in which a plurality of silicon oxide layers and a plurality of silicon nitride layers are alternately stacked each other.

17. The method of claim 16, wherein in the primary cleaning,
   at least a portion of the plurality of silicon oxide layers and at least a portion of the plurality of silicon nitride layers are etched, and
   a difference between an etching rate of the silicon oxide layers and an etching rate of silicon nitride layers is about 5% or less.

18. The method of claim 16, wherein the primary cleaning is performed at a process pressure in a range of about 1500 mTorr to about 2000 mTorr, at a substrate temperature in a range of about 30° C. to about 90° C., and for between about 20 seconds and about 80 seconds.

19. A method of manufacturing a display apparatus, the method comprising:

performing a primary cleaning of an insulating layer in which a contact hole is formed, by using a cleaning gas including a fluorine-containing gas and a hydrogen-containing gas; and performing, by using pure water, a secondary cleaning of the insulating layer in which the contact hole is formed and on which the primary cleaning has been performed, wherein the cleaning gas comprises hydrofluoric acid gas and ammonia gas, and a flow rate ratio between the hydrofluoric acid gas and the ammonia gas is in a range of about 0.5:1 to about 1:0.5.

\* \* \* \* \*